(12) United States Patent
Eckert et al.

(10) Patent No.: US 8,659,310 B2
(45) Date of Patent: Feb. 25, 2014

(54) METHOD AND SYSTEM FOR PERFORMING SELF-TESTS IN AN ELECTRONIC SYSTEM

(75) Inventors: Martin Eckert, Moetzingen (DE); Roland Frech, Ostfildern (DE); Jochen Supper, Herrenberg (DE); Otto A. Torreiter, Leinfelden-Echterdingen (DE)

(73) Assignee: International Business Machines Corporation, Armonk, NY (US)

( * ) Notice: Subject to any disclaimer, the term of this patent is extended or adjusted under 35 U.S.C. 154(b) by 481 days.

(21) Appl. No.: 13/087,550

(22) Filed: Apr. 15, 2011

(65) Prior Publication Data

US 2012/0013356 A1  Jan. 19, 2012

(30) Foreign Application Priority Data

Jul. 14, 2010 (EP) .................................. 10169502

(51) Int. Cl.
*G01R 31/3187* (2006.01)
(52) U.S. Cl.
USPC ..................................................... 324/750.3
(58) Field of Classification Search
USPC .............. 324/762.01–762.1, 750.01–750.3; 257/48; 438/14–18
See application file for complete search history.

(56) References Cited

U.S. PATENT DOCUMENTS

| | | | |
|---|---|---|---|
| 6,768,952 B2 | 7/2004 | Kantorovich et al. | |
| 6,911,827 B2 | 6/2005 | Kantorovich et al. | |
| 7,203,608 B1 | 4/2007 | Aikawa et al. | |
| 7,205,854 B2 * | 4/2007 | Liu | ................................. 331/57 |
| 7,394,274 B2 * | 7/2008 | Muniandy et al. | ......... 324/750.3 |
| 2002/0125897 A1 | 9/2002 | Frech et al. | |
| 2005/0110551 A1 | 5/2005 | Bonaccio et al. | |
| 2008/0211472 A1 | 9/2008 | Barrows et al. | |

FOREIGN PATENT DOCUMENTS

| | | |
|---|---|---|
| EP | 0240102 A3 | 10/1987 |
| WO | 2008097213 | 8/2008 |

OTHER PUBLICATIONS

Waizman, "Integrated Power Supply Frequency Domain Impedance Meter (IFDIM)", IEEE Xplore, Oct. 25, 2004, pp. 217-220.
G Taylor et al., "An Approach to measuring power supply impedance of microprocessors", Electrical Performance of Electronic Packaging, 2001, Oct. 29, 2001, 1 page of Abstract downloaded from Internet at URL: <http://ieeexplore.ieee.org/xpl/freeabs_all.jsp?arnumber=967648>.

* cited by examiner

*Primary Examiner* — Tung X Nguyen
(74) *Attorney, Agent, or Firm* — Walter W. Duft

(57) ABSTRACT

A method and system for performing a self-test of power supply quality for an integrated circuit chip within an electronic system. The electronic system is subjected to a well-defined repetitive activity, such as by using an amplitude modulated system clock tree. With the repetitive activity causing current consumption within the chip, time-domain local power supply voltage (U(t)) is measured for a location on the chip. A set of time-domain measured voltage data (U(t)) is accumulated and transformed into the frequency domain to yield a local voltage profile (U(f)). The local voltage profile (U(f)) is compared with a reference voltage profile ($U_0(f)$) to verify whether power supply quality at the chip location under test is adequate. Alternatively, a local impedance profile Z(f) evaluated from the local voltage profile (U(f)) may be compared to a reference impedance profile $Z_0(f)$.

20 Claims, 5 Drawing Sheets

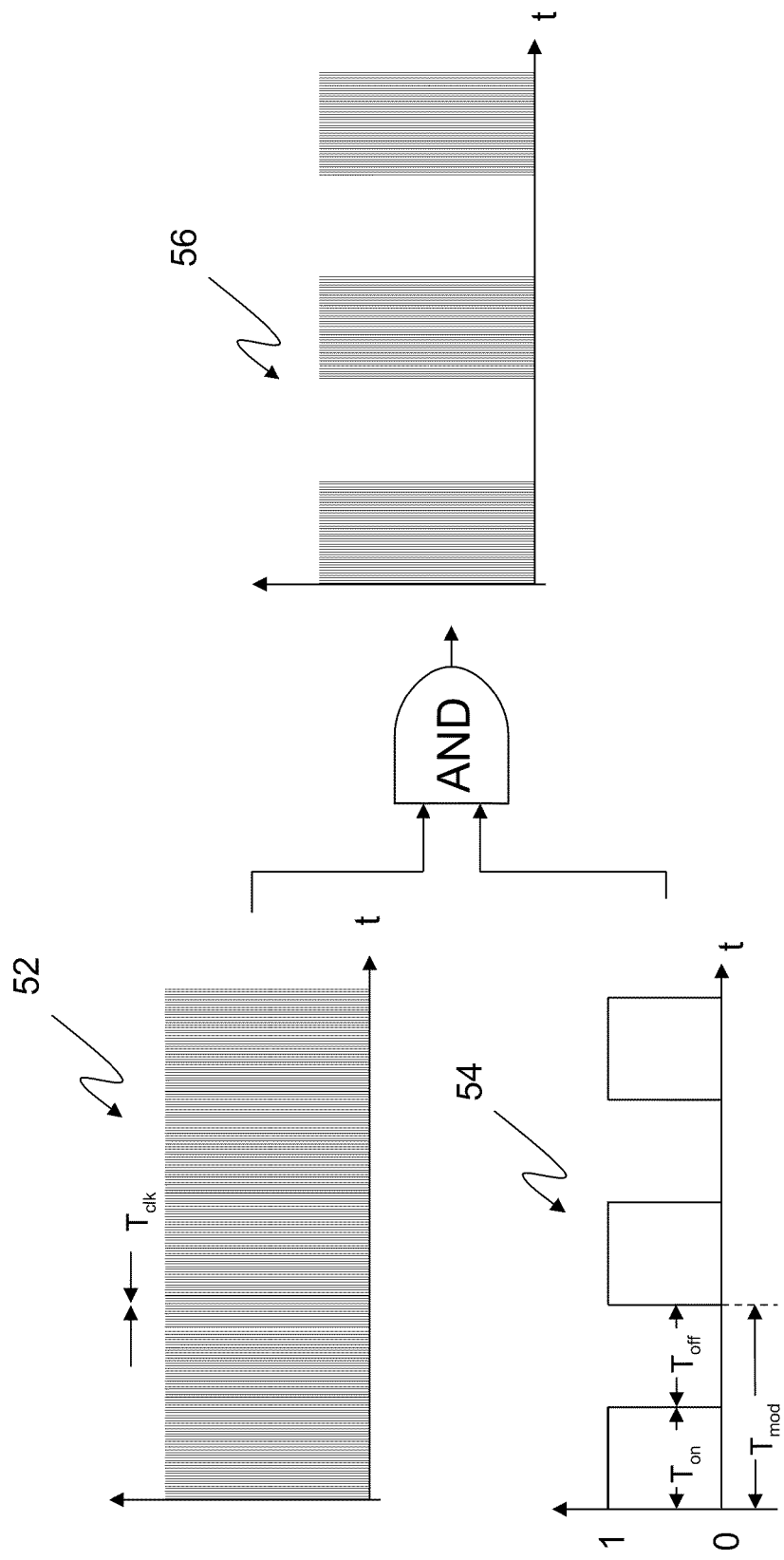

1 Hz                                                                                                  100 GHz

METHOD AND SYSTEM FOR PERFORMING SELF-TESTS IN AN ELECTRONIC SYSTEM

FIELD OF THE INVENTION

The present invention relates generally to integrated circuits and in particular to a method and a system for performing self-tests of local power supply quality in an integrated circuit chip.

BACKGROUND OF THE INVENTION

Modern high-end integrated circuits (ICs) are known to consume high current in a wide frequency range which has to be reliably provided by the IC power supply in order to ensure IC functionality. Therefore, power supply and its distribution is a critical item in high end electronic designs that need to fulfill ambitious requirements with respect to reliability and low impedance. In particular, the IC's power supply network structure has to reliably provide sufficient power in each individual load location within the system. A variety of power domains need to be taken into account, and stable supply voltage levels have to be ensured at each load, independently of actual current demand. Design and implementation is complex and requires deep insight into high frequency behavior of board design and package design. In order to provide the desired functionality for the IC under consideration, there is a need for a methodology to determine whether the actual power distribution within the IC is equivalent to what is required to meet certain design requirements.

Very large scale integration (VLSI) chips designed for use in high end servers are typically equipped with a number of self test mechanisms, such as MBIST (memory built-in self-test), LBIST (logic built-in self-test) etc., that permit the integrated circuit to test itself. Self-testing is used to enable faster and less expensive manufacturing test as well as provide quality checks during operation. The IC chip is supplied with a self-test function that verifies all (or parts of) the internal functionality of the IC. This IC self-test function may be carried out as part of a system self-test that checks RAM and buses during system power-up.

While there are a number of known self-testing methods that cause an IC to test the integrity of its own circuitry or signal integrity, up to now there is no self-test that covers the functionality of the individual power supply at one or more VLSI chip locations.

One present day approach for investigating power supply quality with the chip uses static (DC) load elements to emulate a stimulus for the power supply. Another approach is based on conducting on-chip power supply noise measurements during chip operation with a large number of possible load scenarios. These solutions, however, have a number of drawbacks. For one thing, they require dedicated on-chip power supply measurement setups for each VLSI chip location, with each load scenario requiring its own specific measurement. Additionally, they offer no support for power supply optimization during system design and yield no statement about power supply degradation over system lifetime. Moreover, they furnish no information on malfunction/degradation of discrete power supply components or on partial breakdown of redundant power supply connections. In addition, they require two pins (VDD and GND) to be provided in each specific location within the chip destined for power supply measurements.

U.S. Pat. No. 7,203,608 discloses a method for impedance measurement of a chip within a design by measuring on-chip voltage values in the time domain and performing a Fourier transformation to obtain a measurement of the voltage in the frequency domain. The method makes use of a pseudo impulse current which is difficult to create and control. Moreover, the method described in U.S. Pat. No. 7,203,608 requires measuring switching charge during impulse current, which is complicated to implement and error-prone.

U.S. Pat. No. 6,768,952 describes a method for periodically toggling clock frequency in a chip, generating a periodic current waveform, and conducting a set of voltage measurements. In order to implement this method, the system requires a reset state. Moreover, multiple discrete clock frequencies are used and evaluated. This requires multiple measurements and thus is quite elaborate.

Thus, there is a need for a simple and efficient self-test method for assessing power supply quality and distribution at one or more VLSI chip locations.

SUMMARY OF THE INVENTION

According to a first aspect of the invention, a method for performing a self-test of power supply quality for an integrated chip in an electronic system is provided. The method comprises: (1) subjecting the electronic system to a well-defined repetitive activity; (2) accumulating a set of time-domain measurement data of power supply voltage (U(t)) caused by the activity for a location on said chip; (3) transforming the time-domain measurement data of power supply voltage (U(t)) into a frequency-domain local voltage profile (U(f)), and (4) comparing the local voltage profile.

According to a second aspect of the invention, a system for performing a self-test of power supply quality for an integrated circuit chip within an electronic system is provided. The system comprises: (1) means for subjecting the electronic system to a well-defined repetitive activity; (2) means for accumulating a set of time-domain measurement data of power supply voltage (U(t)) caused by the activity for a location on said chip; (3) means for transforming the time-domain measurement data of power supply voltage (U(t)) into a frequency-domain local voltage profile (U(f)), and (4) means for comparing the local voltage profile.

BRIEF DESCRIPTION OF THE DRAWINGS

The present invention together with objects and advantages thereof may best be understood from the following detailed description of example embodiments, but not restricted to the embodiments, wherein is shown in:

FIG. 1b a schematic plan view of the electronic system of FIG. 1a;

Figure 1A:
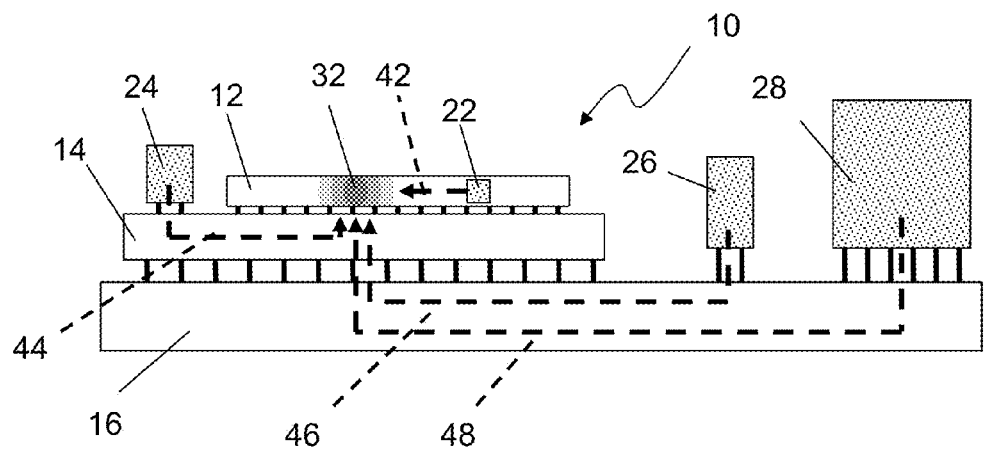
FIG. 1a a schematic sectional view of an electronic system comprising a VLSI integrated circuit (IC) chip mounted on a circuit board.

In the drawings, like elements are referred to with equal reference numerals. The drawings are merely schematic representations, not intended to portray specific parameters of the invention. Moreover, the drawings are intended to depict only typical embodiments of the invention and therefore should not be considered as limiting the scope of the invention.

DETAILED DESCRIPTION OF EXAMPLE EMBODIMENTS

Figure 1B:
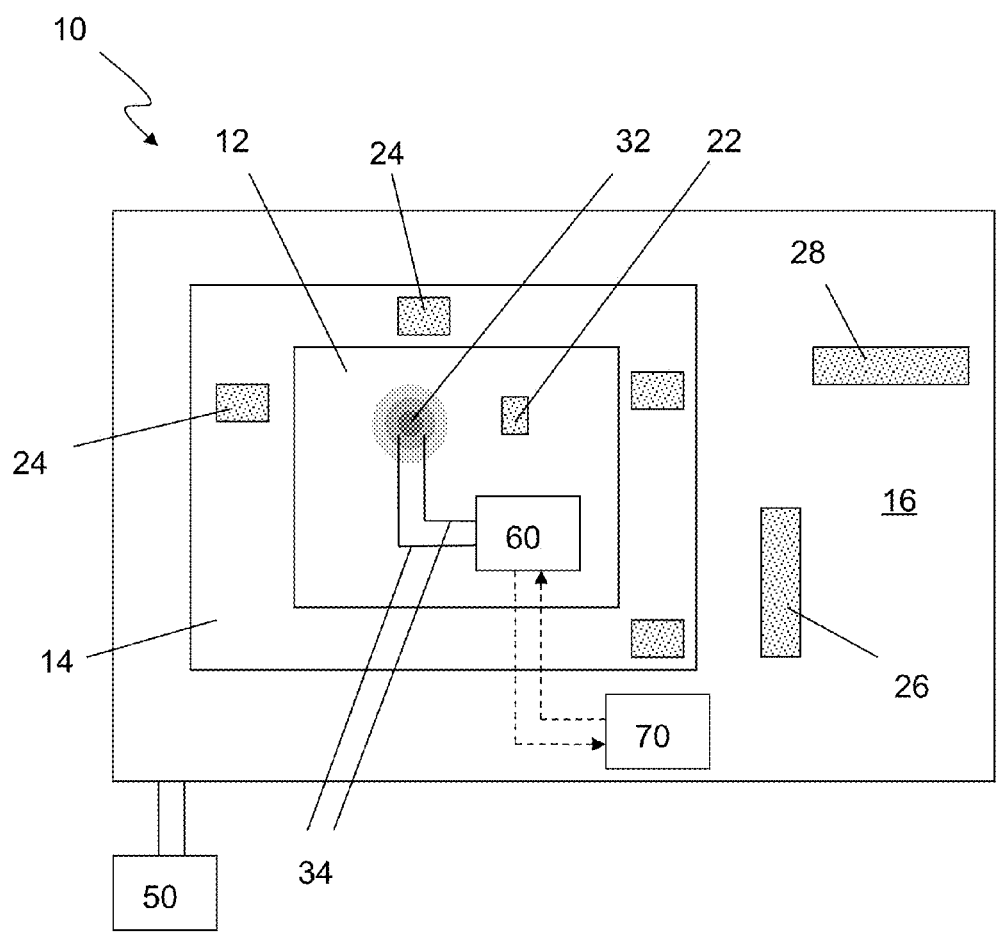

FIG. 1a displays a schematic sectional view of a VLSI chip 12 (other IC chip varieties could also be used) embedded in an electronic system 10 environment. A schematic plan view of electronic system 10 is depicted in FIG. 1b. VLSI chip 12 is mounted on a carrier 14 which, in turn, is mounted on a circuit board 16. Decoupling capacitors 22, 24 and 26, and a DC voltage regulator (DCA) 28 are provided on the chip 12, the carrier 14 and the circuit board 16. There are also one or more load locations 32 on the VLSI chip 12 where various chip functions are performed. Electrical connections 34 are provided to the illustrated load location 32 in order to facilitate power supply testing, as will be described in more detail below. Decoupling capacitors 22, 24 and 26 are respectively connected to the illustrated load location 32 via wiring 42 on chip 12, wiring 44 on carrier 14, and wiring 46 on circuit board 16. DCA 28 connects to load location 32 via wiring 48 on circuit board 16. A power supply 50 provides D.C. power to the circuit board 26.

In order to ensure reliable functionality of VLSI chip 12, all relevant sites within this chip have to be supplied with an adequate amount of electrical power. Specifically, any load location 32 within VLSI chip 12 must obtain sufficient power at all expected operational frequencies in order for the load functionality residing at each location to perform as specified.

The power supply network properties of VLSI chip 12 residing within electronic system 10 may be assessed by measuring the local power supply impedance profile Z(f) at the one or more load locations 32 within VLSI chip 12. The local power supply impedance profile Z(f) is defined as the ratio of the associated voltage and current spectra U(f), I(f) at a specific location 32: |Z(f)|=|U(f)/I(f)|. The power supply impedance profile Z(f) is an inherent feature of any power supply distribution network and depends on frequency f, packaging infrastructure, decoupling hierarchy, individual local geometry as well as component interactions (resonances).

A measurement of the local power supply impedance profile Z(f) at a location 32 of VLSI chip 12 requires data on the time dependence of voltage and current U(t), I(t) at the location. While it is relatively easy to carry out local voltage measurements U(t) with high accuracy and high temporal resolution, measurements of the current I(t) are difficult and error-prone. Thus, rather than relying on an inaccurate current measurement, a well-defined, periodically varying activity is imposed at location 32 in chip 12, the current consumption of which can be calculated analytically with very high accuracy. Only two actual current measurements are used and these are easy to obtain because they are made under quasistatic conditions.

Figure 2B:
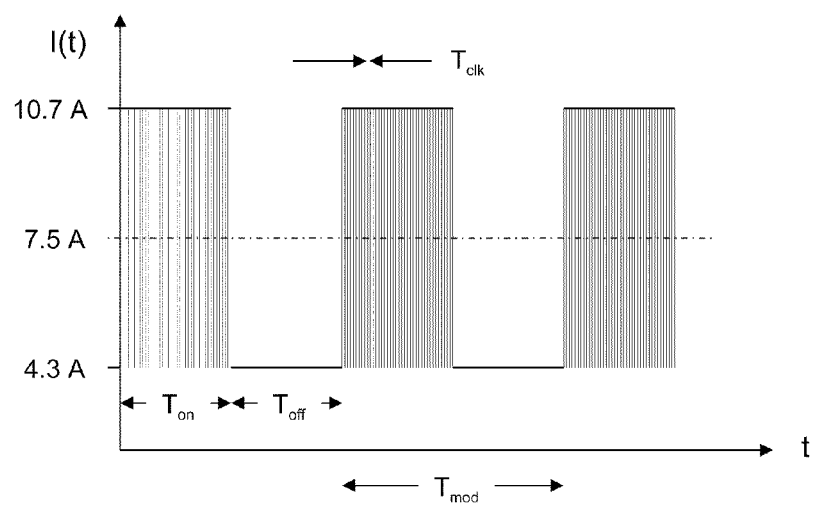
FIG. 2b a schematic diagram of local current consumption due to an activation by a clock signal modulated with a square wave.

This periodic activity may be represented by periodically toggling a simple on-chip activity, e.g. by periodically switching on and off the main clock tree. This is schematically illustrated in FIG. 2a which shows a main clock tree signal 52 that is AND gated with a periodic square wave 54 to yield amplitude modulated clock tree signal 56. FIG. 2b shows a schematic diagram of a current consumption due to the excitation by clock tree signal 52 modulated with square wave 54. Assuming, for example, a clock tree signal 52 of frequency $f_{clk}$=800 MHz is periodically modulated with a square wave signal 54 of modulation frequency $f_{mod}$=1 MHz, the modulation period $T_{mod}$ would be about 1 μs while the clock period $T_{clk}$ would be about 1.25 ns.

The main clock tree signal 52 constitutes a very simple and highly reproducible signal and is present in any integrated circuit 12, so that it constitutes a periodic activity that can be easily implemented. Clock toggling generates a high percentage of maximum dynamic current consumption in a typical IC and thus constitutes a well-suited excitation of chip 12. Moreover, the clock network and master/slave flip flops are distributed across the entire chip 12 and consume considerable amounts of current, so that a stimulus making use of the clock network will create a power consumption spectrum which is representative of the couplings within electronic system 10, and which preserves interactions between the on-chip 12 decoupling, packaging 14 and circuit board 16 power delivery networks.

The local temporal variation I(t) of current consumption due to the square wave modulated clock tree signal 56 may be expressed as $$I(t) = (I_{leak} + I_0) + I_0 \cdot \left( \frac{4}{\pi} \cdot \sin\Omega_{mod}t + \frac{4}{3\pi} \cdot \sin3\Omega_{mod}t + \frac{4}{5\pi} \cdot \sin5\Omega_{mod}t + \ldots \right) \quad (A)$$

where $I_{leak}$ is the leakage current without the clock signal applied (in the example of FIG. 2b, $I_{leak}$=4.3 A), $I_0$ is an active current representing one-half of the current amplitude with the clock signal applied (in the example of FIG. 2b, $I_0$=3.2 A), and $\Omega_{mod}$=$2\pi f_{mod}$. The elements within the parentheses (from left to right) respectively represent the base modulation frequency $f_{mod}$ and its $3^{rd}$ and $5^{th}$ harmonics. As indicated in formula (A), higher harmonics may also be included. The power supply current demand of both modulation states (i.e. parameters $I_{leak}$ and $I_0$) can be determined from a quasistatic measurement at the external power supply 50 or other convenient location. The $I_{leak}$ current may be obtained from a current measurement without clock activity, whereas the $I_0$ current may be obtained from a current measurement with a continuously operating clock.

Once I(t) has been determined, a frequency-domain current consumption spectrum I(f) may be calculated by Fourier series expansion. Note that in order for current I(t) at location 32 of VLSI chip 12 to be accurately described by the formula (A), it is desired that the periodic switching of the clock tree signal 52 be the only power demanding activity on the chip 12; i.e. no other concurrent chip activities should be carried out at the same time.

Figure 1C:
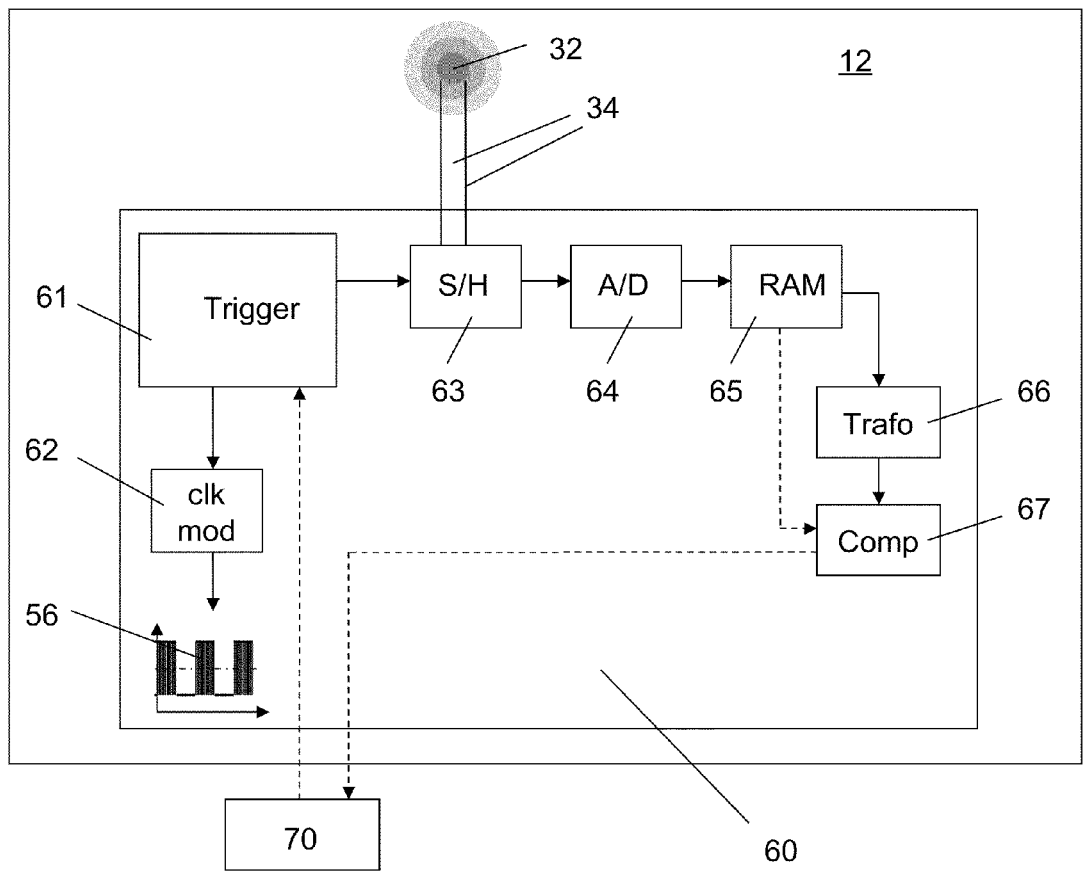
FIG. 1c a schematic view of an on-chip self-test unit contained in the VLSI chip of FIG. 1a FIG. 2a a schematic diagram of a clock signal modulated with a square wave.

The signature of the local on-chip power supply voltage U(t) encountered during chip activity due to the amplitude modulated clock tree signal 56 is measured at location 32. Based on this measurement, power supply quality is assessed using a self-test system 60 that may be wholly or partially located on the chip 12. A schematic representation of fully on-chip self-test system 60 is shown in FIG. 1c. Self-test system 60 may carry out measurements at various specific locations 32 within chip 12 and may evaluate these local data to furnish information on the power supply distribution within the chip. As described in more detail below, self-test system 60 may include the following components: a trigger unit 61, a clock modulation unit 62, a sample-and-hold (S/H) measurement system 63, an analog-to-digital (A/D) converter 64, a storage unit (RAM) 65, a transformation unit 66, a comparison unit. An external system self-test unit 70 is also shown in FIGS. 1b and 1c. This too is discussed in more detail below.

Figure 3:
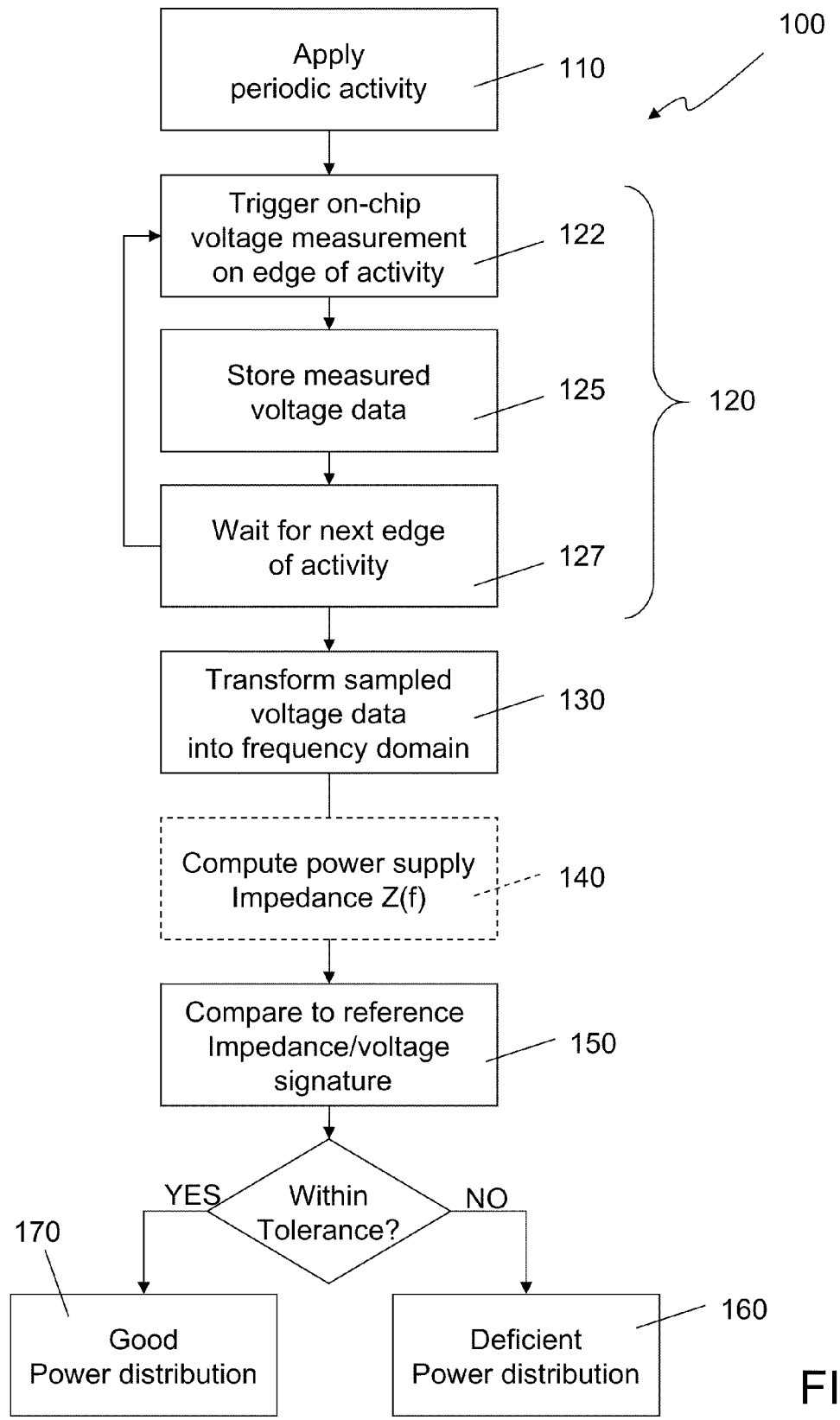
FIG. 3 a schematic flow diagram of a self-test method for assessing a local power supply profile.

When self-test system 60 is activated, it will perform a self-test routine on chip 12. A flow diagram of an example self-test method 100 is shown in FIG. 3.

In a first step 110, a periodic activity is applied to chip 12. In an example embodiment, this periodic activity corresponds to the amplitude modulated clock tree signal 56 shown in FIG. 2a. Note that, in order to obtain reliable results for the power supply distribution within chip 12, this periodic activity must be the sole excitation of chip 12 during execution of self-test routine 100.

With a periodic activity applied to chip 12, local voltage measurements are performed at a specific load location 32 within chip 12 (step 120). The electrical connections 34 shown in FIG. 1b are used to link self-test system 60 to location 32. Connections 34 enable VDD and GND measurements at location 32 to be carried out by S/H measurement system 63 within self-test system 60. Loop 120 is iterated a predetermined number of N times, so that N voltage measurements are taken at consecutive times $t_i$ (i=1, ..., N), yielding local voltage values $U_i$=VDD($t_i$)−GND($t_i$). The measurements are triggered at the edge of the periodic activity 56 (step 122), and the values of $U_i$ thus obtained are digitized in A/D converter 64 and stored in storage unit 65 within on-chip self-test system 60 (step 125). Once a set of voltage values $U_i$ (i=1, ..., N) has been accumulated, this set is transformed by transformation unit 66 into the frequency domain (step 130), yielding a power supply voltage spectrum U(f) of load 32 within chip 12.

Note that the N sampling steps may be provided in a variety of alternative ways. In particular, there may be N S&H and A/D conversion circuits which are triggered in a staged manner with a time offset of i*($T_{mod}$/N), if, i=1, ..., N. As an example, assuming $f_{clk}$=1 GHz and $f_{mod}$=1 MHz, and assuming that the analysis is to be carried out up to clock frequency $f_{clk}$, then at least 2000 samples are required for evaluation. Exact evaluation may be obtained from the Nyquist sampling theorem (in order to avoid aliasing effects in the frequency domain). Longer measurement times (i.e. exceeding the duration of one cycle of $f_{mod}$) are not required but may be advantageous for reducing the signal to noise ratio (S/N) and improving the signal quality of the measurements.

Note also that storage unit 65 has to be dimensioned in such a way that it can store a full sample set of measurement values. In the example described above, storage unit 65 must be capable of holding 2000 measurement values, each having 8 bits from A/D conversion step, and thus storage unit 65 must be >2 kB.

Once the power supply voltage spectrum U(f) has been determined (step 130), it can be used for calculating the power supply impedance $|Z(f)|=|U(f)|/|I(f)|$ at the specific location 32 on the chip 12 (step 140), assuming that the current consumption spectrum I(f) corresponding to periodic activity 56 has been determined. As described above, current consumption spectrum I(f) need not be measured but may be calculated using formula (A). Current consumption spectrum I(f) may be determined beforehand and stored in storage unit 65 within self-test system 60.

The actual power supply impedance signature Z(f) at a location 32 of VLSI chip 12, as computed in step 140, may be compared with a reference power supply impedance signature $Z_0$(f) characteristic of good power supply quality at the same location (step 150). In this context, the term "good" power supply quality at a location 32 designates a power supply quality that ensures good load functionality at the location 32 over the full frequency spectrum. The comparison between actual impedance signature Z(f) and reference signature $Z_0$(f) may be formed by subtraction. If the impedance difference $\Delta=\Sigma|Z_0(f)-Z(f)|$ between actual and reference impedance signatures exceeds a predetermined threshold, this is indicative of an inadequate power supply distribution at location 32 (step 160). If, on the other hand, the actual impedance spectrum Z(f) displays only minor differences from reference signature $Z_0$(f), this is indicative that power supply distribution at location 32 in chip 12 concurs with specification (step 170). Note that there are various options for forming the impedance difference, e.g. |Delta(f)|<threshold for each frequency step (f1, f2, fn) $Z_0$(f)−Z(f), etc.

Note that activation of chip 12 (based on clock switching) extends across the entire chip 12 or region to which the clock tree is connected. While this activation encompasses all regions of chip 12, the power supply quality is evaluated by location 32, so that the impedance profile Z(f) evaluated using method 100 is only valid at such location. If power supply quality is to be evaluated at multiple locations 32, reference profiles $Z_0$(f) need to be determined and stored for each such location.

Figure 4:
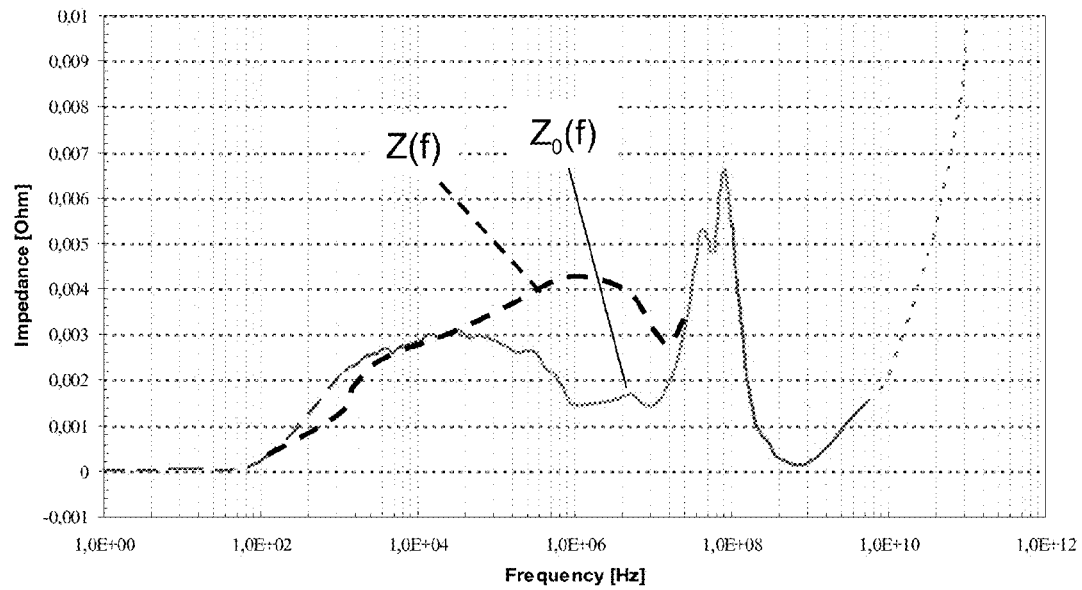
FIG. 4 a diagram of a reference power supply impedance profile as a function of frequency, together with an actual (measured) profile.

FIG. 4 shows an example of the frequency dependence of a reference impedance spectrum $Z_0$(f) over a wide range of frequencies (from 100 Hz to 10 GHz), together with an impedance signature Z(f) as obtained from a measurement in a frequency range between a modulation frequency $f_{mod}$ of about =100 Hz and clock frequency $f_{clk}$ of about 100 MHz. In a frequency range between 100 kHz and 50 MHz, the measured impedance signature Z(f) differs significantly from reference signature $Z_0$(f), indicating that decoupling capacitors may be missing (or not be functioning as specified). Note that generally the impedance profile $Z_0$(f), Z(f) is a vector in a complex plane comprising a vector magnitude and an angle (corresponding to a degree of rotation of that vector magnitude |Z(f)| due to capacitive and inductive reactance). A more sophisticated analysis can be achieved by taking this angle component into account when comparing $Z_0$(f), Z(f).

Figure 5:
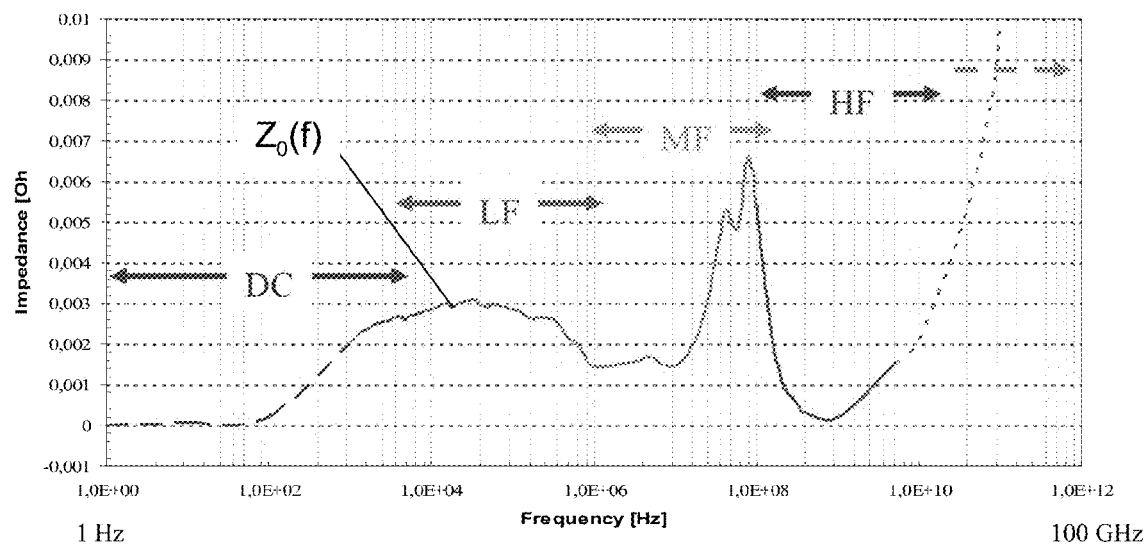
FIG. 5 a diagram of a reference power supply impedance profile as a function of frequency.

Generally, the frequency dependence of power supply impedance profile Z(f) yields information on specific properties of the various network portions within electronic system 10. This is schematically shown in FIG. 5 which displays the reference profile $Z_0$(f) of FIG. 4 in the range between 100 Hz and 10 GHz. In a quasistatic region marked by "DC", frequency behavior of power supply impedance profile Z(f) is largely determined by the DCA 28 and voltage regulation loop that includes the wiring 48 on circuit board 16 (see FIG. 1a). In a low frequency region marked by "LF", power supply impedance behavior is dominated by low frequency decoupling capacitors 26 and the wiring 46 on the circuit board 16. In adjacent mid frequency region marked by "MF", power supply impedance behavior is largely determined by mid frequency decoupling capacitors 24 and the wiring 44 on carrier board 14, whereas in high frequency region marked by "HF", power supply impedance behavior is influenced mostly by on-chip decoupling properties (due to capacitors 22, circuits, the wiring 42 on chip 12, etc.).

By connecting self-test system 60 to several load locations 32 within chip 12, method 100 may be carried out for multiple locations (concurrently or consecutively). Self-test method 100 thus can be used for determining whether a power distribution within VLSI chip 12 fulfills a pre-determined specification, this specification corresponding to a reference power supply impedance signature $Z_0$(f).

If Z(f) is found to deviate from reference $Z_0$(f) in one or several load locations 32, corresponding control flags may be put up in self-test system 60 and/or control signals may be sent to the system self-test unit 70 indicating that chip 12 (and/or a specific location 32 within chip 12) is deficient. The self-test unit 70 may be located off-chip, such as on the circuit board 16. Based on this information, system self-test unit 70 may issue a warning to a system user and provide information on the specific chip 12 and/or location 32 in which the deficiency was detected.

Note that since current spectrum I(f) is calculated from formula (A), it is fully determined by the shape of the periodic activity (e.g. amplitude modulated clock tree signal 56) as well as quasistatic parameters $I_{leak}$ and $I_0$, so that the actual current spectrum I(f) is identical to a reference current spectrum $I_0$(f). As a consequence, a comparison of actual and reference supply impedance signatures Z(f), $Z_0$(f) is in fact equivalent to a comparison of the actual (measured) voltage spectrum U(f) to a reference voltage spectrum $U_0$(f). This means that it is not crucial to evaluate the power supply impedance signature Z(f) (step 140); rather, it is satisfactory to base the assessment of the power distribution within VLSI chip 12 on the voltage spectrum U(f).

Although comparing the actual impedance profile Z(f) to reference profile Z0(f) gives quantitative insights on which aspect of the system is defective, these steps 130, 140 may be cost intensive (since they require circuits and/or computing power for calculating I(f) and Z(f). Advantageously, a qualitative comparison does not in fact require computation of $I_{leak}$ and $I_0$ in formula (A). Rather, it is sufficient to store that "simple signature" into storage unit 65 beforehand.

As shown schematically in FIG. 1c, and as briefly mentioned above, self-test system 60 comprises a trigger unit 61. The purpose of the trigger unit 61 is for starting (and terminating) the periodic activity (e.g. amplitude modulated clock tree signal 56). While the square wave signal 54 with modulation frequency $f_{mod}$ is preferably created in units 61 or 62 on chip 12, modulation may also be generated in a location off chip 12, e.g. in the system self-test unit 70. Trigger unit 61 may be activated during system start-up or by starting periodic (automatic) system self-tests. This activation could be initiated by trigger unit 61 receiving a trigger signal from system self-test unit 70, such as a rising or falling edge of square wave signal 54. When activated, trigger unit 61 triggers clock modulation unit 62 to initiate the periodic activity in chip 12 and ensures that all other activities within chip 12 are shut off. Subsequently, trigger unit 61 triggers measurement system 63 to acquire local voltage data $U_i$ which are stored in storage unit 65. Storage unit 65 may also contain data relating to current consumption spectrum I(f) as well as reference spectra $U_0$(f) and/or $Z_0$(f). Self-test system 60 also comprises additional firmware/software capabilities such as transformation unit 66 and comparison unit 67. Transformation unit 66 transforms power supply voltage values $U_i$ measured in the time domain into a frequency domain signature U(f). Comparison unit 67 compares the actual (measured) frequency domain signature U(f) or Z(f) to a reference frequency domain signature $U_0$(f) or $Z_0$(f).

Note that some functions of self-test unit 60, such as storage unit 65 as well as transformation unit 66 and comparison unit 67, may reside (fully or partly) in a different location within electronic system 10 (e.g. with the self-test unit 70 on circuit 16). However, with respect to storage unit 65, it may be desirable to locate this unit on chip 12 because fast RAM access is required for on-line storage of measurement values.

Method 100 enables a quantitative measurement methodology of actually available power supply quality vs. frequency at an installed VLSI chip location, i.e. for a VLSI chip assembled on its carrier and operating in system environment.

By comparing measured voltage (or impedance) profiles to reference profiles, method 100 identifies specific power supply deficiencies during early VLSI chip tests and/or system start-up and allows determination of the specific power consumption of dedicated chip activities.

On-chip self-test system 60 applies hardware elements and software to quantify power supply distribution properties at one or more locations 32 in the frequency domain during system power-on self test or on demand, e.g. at regular intervals during operation. As mentioned, self-test system 60 can be integrated directly into the chip 12 that it tests, or could have some of its components located off-chip. Likewise, the electrical connections 34 linking self-test system 60 to the location 32 under investigation may be fully or partially integrated into chip 12. Note that modulation unit 62 only needs to generate a single modulation frequency; there is no requirement for any additional on-chip logic for generating different clock modulation frequencies.

Method 100 represents a simple scheme for generating a power supply GOOD/BAD indication for each individual VLSI chip location 32 over the lifetime of the chip during every system power-on self test. A system failure analysis can use this indication to include/exclude power supply network. Moreover, method 100 offers a quantitative analysis of power supply signature which pinpoints any erroneous elements in the power supply distribution network (both components and connections).

Typically, VLSI chip 12 will form part of a larger electronic system 10 which in turn forms part of a machine such as a computer, workstation etc. If, during runtime, this machine encounters a problem, a user will typically start a recovery routine. In this case, the system clock will typically be frozen in a static state that preserves the actual machine status. In order to enable self-test method 100 to operate during this "frozen" state of electronic system 10, it is advisable to provide a master/slave clock design. While the slave clock is frozen (thus preserving the system's actual state), the master clock may be used for carrying out method 100 without destroying the "frozen" state. Once the error has been found and the machine is restarted, the slave clock may be reactivated. Thus, self-test method 100 can be integrated into an error-detection scheme which can be carried out routinely during system failures.

The invention claimed is:

1. A method for performing a self-test of power supply quality for an integrated circuit chip within an electronic system, comprising:
    subjecting said electronic system to a well-defined repetitive activity;
    accumulating a set of time-domain measurement data of power supply voltage (U(t)) caused by said activity for a location on said chip;
    transforming said time-domain measurement data of power supply voltage (U(t)) into a frequency-domain local voltage profile (U(f)); and
    comparing said local voltage profile (U(f)) to a reference voltage profile ($U_0$(f)).

2. The method according to claim 1, further comprising:
    evaluating a local impedance profile (Z(f)) from said local voltage profile (U(f)) and a current profile (I(f)) stored in a storage within system; and
    comparing said local impedance profile (Z(f)) to a reference impedance profile ($Z_0$(f)).

3. The method according to claim 2, wherein said current profile (I(f)) is obtained from a temporal behavior of a current consumption (I(t)) due to said repetitive activity.

4. The method according to claim 3, wherein said temporal behavior of a current consumption (I(t)) is determined analytically from quasistatic measurements of a leakage current ($I_{leak}$) obtained without said repetitive activity being applied and an active current ($I_0$) obtained with said repetitive activity being applied.

5. The method according to claim 1, wherein said repetitive activity comprises periodically switching a system clock tree on and off.

6. The method according to claim 1, wherein said repetitive activity is generated by a clock tree within a master/slave design, so that in case of failure of said electronic system, said repetitive activity is generated by a master clock while an actual system state is preserved by a slave clock set into an inactive state.

7. The method according to claim 1, wherein said accumulating is performed by circuitry located wholly or partially on said chip.

8. The method according to claim 1, wherein said method is carried out during a system power-on operation.

9. The method according to claim 1, wherein said method is carried out periodically during system operation.

10. The method according to claim 1, wherein said method is performed by a system integrated wholly or partially in said chip for which the self-test is to be executed.

11. A system for performing a self-test of power supply quality for an electronic system comprising an integrated circuit chip, comprising:
    means for subjecting said electronic system to a well-defined repetitive activity;
    means for accumulating a set of time-domain measurement data of power supply voltage (U(t)) caused by said activity for a location on said chip;
    means for transforming said time-domain measurement data of power supply voltage (U(t)) into a frequency-domain local voltage profile (U(f)); and
    means for comparing said local voltage profile (U(f)) to a reference voltage profile ($U_0$(f)).

12. The system according to claim 11, further comprising:
    means for evaluating a local impedance profile (Z(f)) from said local voltage profile (U(f)) and a current profile (I(f)) stored in a storage within system; and
    means for comparing said local impedance profile (Z(f)) to a reference impedance profile ($Z_0$(f)).

13. The system according to claim 12, wherein said current profile (I(f)) is obtained from a temporal behavior of a current consumption (I(t)) due to said repetitive activity.

14. The system according to claim 13, wherein said temporal behavior of a current consumption (I(t)) is determined analytically from quasistatic measurements of a leakage current ($I_{leak}$) obtained without said repetitive activity being applied and an active current ($I_0$) obtained with said repetitive activity being applied.

15. The system according to claim 11, wherein said repetitive activity comprises periodically switching a system clock tree on and off.

16. The system according to claim 11, wherein said repetitive activity is generated by a clock tree within a master/slave design, so that in case of failure of said electronic system, said repetitive activity is generated by a master clock while an actual system state is preserved by a slave clock set into an inactive state.

17. The system according to claim 11, wherein said means for accumulating comprises circuitry located wholly or partially on said chip.

18. The system according to claim 11, wherein said system is integrated wholly or partially in said chip for which the self-test is to be executed.

19. The system according to claim 11, wherein:
    said means for applying a repetitive activity and said means for measuring a time-domain power supply voltage (U(t)) reside in said chip; and
    said means for evaluating said local voltage profile (U(f)) and said means for comparing said local voltage profile to said reference voltage profile ($U_0$(f)) reside in a location outside of said chip.

20. A system for performing a self-test of power supply quality for an electronic system comprising an integrated circuit chip, comprising:
    a trigger unit and a clock modulation unit operable to subject said electronic system to a modulated clock signal representing a well-defined repetitive activity;
    a measurement system, an analog-to-digital converter and a storage unit operable to accumulating a set of time-domain measurement data of power supply voltage (U(t)) caused by said activity for a location on said chip;
    a transformation unit operable to transform said time-domain measurement data of power supply voltage (U(t)) into a frequency-domain local voltage profile (U(f)); and
    a comparison unit operable to compare said local voltage profile (U(f)) to a reference voltage profile ($U_0$(f)).

* * * * *